(12) United States Patent
Pylant et al.

(10) Patent No.: US 11,885,682 B2
(45) Date of Patent: Jan. 30, 2024

(54) SYSTEM, APPARATUS, AND METHOD FOR SPECTRAL FILTERING

(71) Applicant: Verity Instruments, Inc., Carrollton, TX (US)

(72) Inventors: Chris D. Pylant, Carrollton, TX (US); Timothy C. Michals, Carrollton, TX (US); John D. Corless, Carrollton, TX (US)

(73) Assignee: Verity Instruments, Inc., Carrollton, TX (US)

( * ) Notice: Subject to any disclaimer, the term of this patent is extended or adjusted under 35 U.S.C. 154(b) by 0 days.

(21) Appl. No.: 17/915,936

(22) PCT Filed: Apr. 13, 2022

(86) PCT No.: PCT/US2022/024679
§ 371 (c)(1),
(2) Date: Sep. 29, 2022

(87) PCT Pub. No.: WO2022/221446
PCT Pub. Date: Oct. 20, 2022

(65) Prior Publication Data
US 2023/0194342 A1 Jun. 22, 2023

Related U.S. Application Data

(60) Provisional application No. 63/174,126, filed on Apr. 13, 2021.

(51) Int. Cl.
*G01J 3/02* (2006.01)
*G01J 3/28* (2006.01)
*H01L 21/66* (2006.01)

(52) U.S. Cl.
CPC ..... *G01J 3/0275* (2013.01); *G01J 2003/2826* (2013.01); *H01L 22/10* (2013.01)

(58) Field of Classification Search
CPC .. G01J 3/0275; G01J 2003/2826; H01L 22/10
(Continued)

(56) References Cited

U.S. PATENT DOCUMENTS 5,807,761 A 9/1998 Coronel et al.
6,351,683 B1 * 2/2002 Johnson ............ H01J 37/32174
438/10

(Continued)

FOREIGN PATENT DOCUMENTS

CN 108881746 A 11/2018
JP 2003287499 A 10/2003
JP 2020513647 A 5/2020

*Primary Examiner* — Md M Rahman

(57) ABSTRACT

The disclosure provides improved processing of optical data by identifying anomalous signals in the electrical data representing the optical data. The improved processing can also include modifying the identified anomalous signal data to provide a truer representation of the optical data. The disclosed processing can be used by various systems and apparatuses for processing spectral data corresponding to the optical data. The improved processing can be used to improve the monitoring of semiconductor processes and, therefore, improve the overall semiconductor processes. In one example, a method of processing spectral data includes: (1) receiving temporally separated spectral data samples, and (2) identifying one or more anomalous signals in an intermediate one of the temporally separated spectral data samples based on at least one preceding and at least one subsequent ones of the spectral data samples.

23 Claims, 14 Drawing Sheets

(58) Field of Classification Search
USPC .......................................................... 356/73
See application file for complete search history.

(56) References Cited

U.S. PATENT DOCUMENTS

| | | |
|---|---|---|
| 7,049,156 B2 | 5/2006 | Kueny |
| 10,460,998 B2 | 10/2019 | Fujimori |
| 10,572,995 B2 | 2/2020 | Ivoue et al. |
| 2020/0003728 A1* | 1/2020 | Majumdar ....... G01N 27/44721 |
| 2020/0097852 A1* | 3/2020 | Zhu ................... G06F 18/23213 |
| 2022/0190541 A1* | 6/2022 | Renninger ......... G02B 6/02214 |

* cited by examiner

SYSTEM, APPARATUS, AND METHOD FOR SPECTRAL FILTERING

CROSS-REFERENCE TO RELATED APPLICATION

This application is the National Stage of, and therefore claims the benefit of, International Application No. PCT/US2022/024679 filed on Apr. 13, 2022, entitled "SYSTEM, APPARATUS, AND METHOD FOR SPECTRAL FILTERING," which claims the benefit of U.S. provisional application 63/174,126, filed on Apr. 13, 2021. The above applications are commonly assigned with this National Stage application and are incorporated herein by reference in their entirety.

TECHNICAL FIELD

This disclosure relates, generally, to optical spectroscopy systems and methods of use, and more specifically, to improved spectral filtering of data recorded from multichannel imaging spectrometers used during semiconductor processing.

BACKGROUND

Optical monitoring of semiconductor processes is a well-established method for controlling processes such as etch, deposition, chemical mechanical polishing and implantation. Optical emission spectroscopy (OES) and interferometric endpoint (IEP) are two basic types of modes of operation for data collection. In OES applications light emitted from the process, typically from plasmas, is collected and analyzed to identify and track changes in atomic and molecular species which are indicative of the state or progression of the process being monitored. In IEP applications, light is typically supplied from an external source, such as a flashlamp, and directed onto a workpiece. Upon reflection from the workpiece, the sourced light carries information, in the form of the reflectance of the workpiece, which is indicative of the state of the workpiece. Extraction and modeling of the reflectance of the workpiece permits understanding of film thickness and feature sizes/depth/widths among other properties.

BRIEF DESCRIPTION OF THE DRAWINGS

Reference is now made to the following descriptions taken in conjunction with the accompanying drawings that illustrate examples according to the principles of the disclosure, in which.

DETAILED DESCRIPTION

Figure 1:
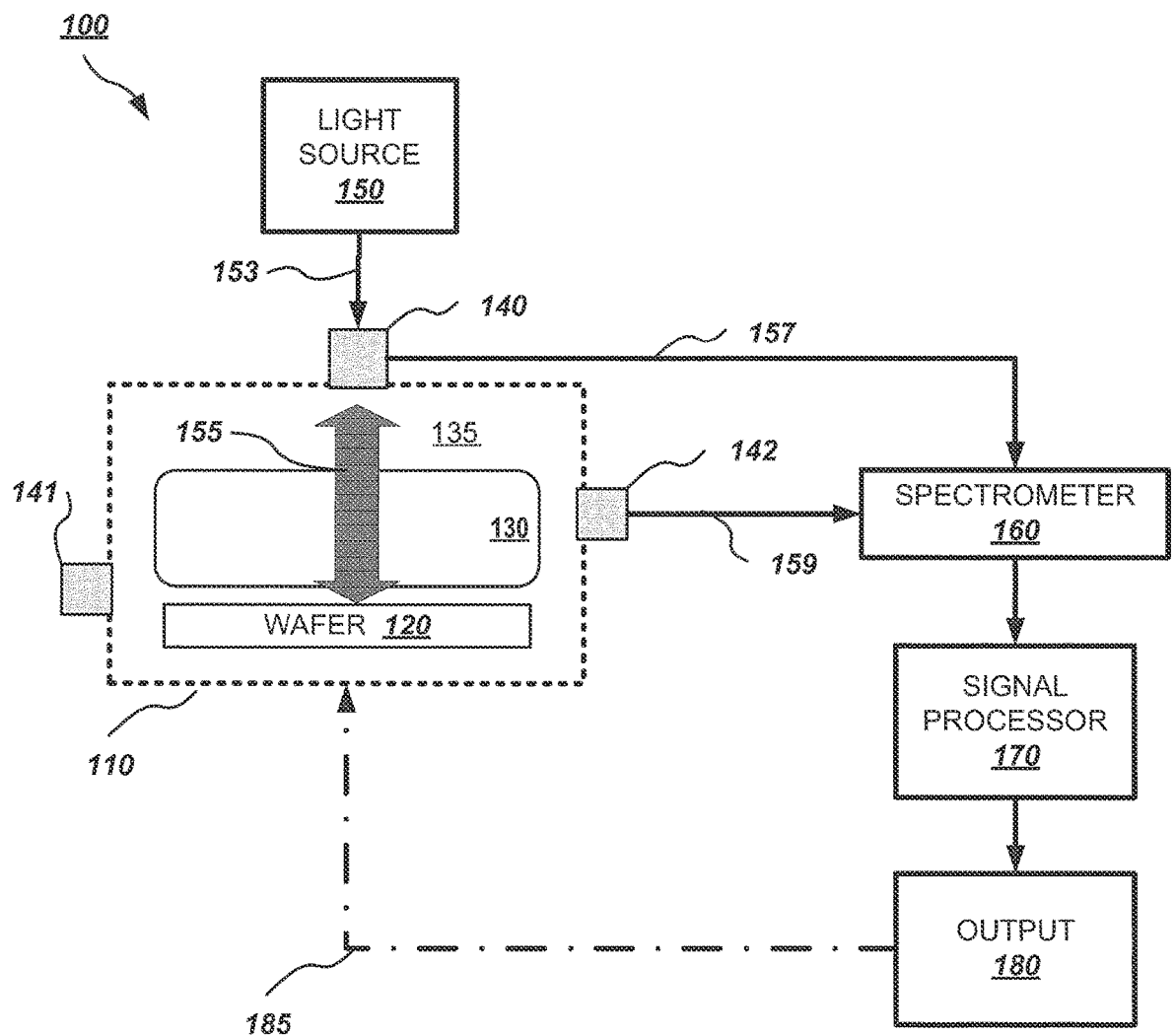
FIG. 1 is a block diagram of a system for employing OES and/or IEP to monitor and/or control the state of a plasma or non-plasma process within a semiconductor process tool.

In the following description, reference is made to the accompanying drawings that form a part hereof, and in which is shown by way of illustration, specific embodiments in which the invention may be practiced. These embodiments are described in sufficient detail to enable those skilled in the art to practice the invention, and it is to be understood that other embodiments may be utilized. It is also to be understood that structural, procedural and system changes may be made without departing from the spirit and scope of the present invention. The following description is, therefore, not to be taken in a limiting sense. For clarity of exposition, like features shown in the accompanying drawings are indicated with like reference numerals and similar features as shown in alternate embodiments in the drawings are indicated with similar reference numerals. Other features of the present invention will be apparent from the accompanying drawings and from the following detailed description. It is noted that, for purposes of illustrative clarity, certain elements in the drawings may not be drawn to scale.

The constant advance of semiconductor processes toward faster processes, smaller feature sizes and more complex structures places great demands on process monitoring technologies. For example, higher data rates are required to accurately monitor much faster etch rates on very thin layers where changes in Angstroms (a few atomic layers) are critical such as for FINFET and 3D NAND structures. Wider optical bandwidth and greater signal-to-noise are required in many cases both for OES and IEP methodologies to aid in detecting small changes either/both for reflectances and optical emissions. Cost and packaging sizes are also under constant pressure as the process equipment becomes more complex and costly itself. All of these requirements seek to advance the performance of optical monitoring of semiconductor processes. Regardless if for OES or IEP methodologies, an important component of many optical monitoring systems are spectrometers and their ability to accurately convert received optical data to electrical data for control and monitoring of semiconductor processes.

Accordingly, disclosed herein are processes, systems, and apparatuses that provide improved processing of optical data by identifying anomalous signals in the electrical data representing the optical data. The improved processing can also include modifying the anomalous signals, or the data associated with the anomalous signals, in either the analog or digital signal domain to provide a truer representation of the optical data. The improved processing can be used to more accurately monitor semiconductor processes.

With specific regard to monitoring and evaluating the state of a semiconductor process within a process tool, FIG. 1 illustrates a block diagram of process system 100 utilizing OES and/or IEP to monitor and/or control the state of a plasma or non-plasma process within a semiconductor process tool 110. Semiconductor process tool 110, or simply process tool 110, generally encloses wafer 120 and possibly process plasma 130 in a typically, partially evacuated volume of a chamber 135 that may include various process gases. Process tool 110 may include one or multiple optical interfaces, or simply interfaces, 140, 141 and 142 to permit observation into the chamber 135 at various locations and orientations. Interfaces 140, 141 and 142 may include multiple types of optical elements such as, but not limited to, optical filters, lenses, windows, apertures, fiber optics, etc.

For IEP applications, light source 150 may be connected with interface 140 directly or via fiber optical cable assembly 153. As shown in this configuration, interface 140 is oriented normal to the surface of wafer 120 and often centered with respect to the same. Light from light source 150 may enter the internal volume of chamber 135 in the form of collimated beam 155. Beam 155 upon reflection from the wafer 120 may again be received by interface 140. In common applications, interface 140 may be an optical collimator. Following receipt by interface 140, the light may be transferred via fiber optic cable assembly 157 to spectrometer 160 for detection and conversion to digital signals. The light can include sourced and detected light and may include, for example, the wavelength range from deep ultraviolet (DUV) to near-infrared (NIR). Wavelengths of interest may be selected from any subrange of the wavelength range. For larger substrates or where understanding of wafer non-uniformity is a concern, additional optical interfaces (not shown in FIG. 1) normally oriented with the wafer 120 may be used. The processing tool 110 can also include additional optical interfaces positioned at different locations for other monitoring options.

For OES applications, interface 142 may be oriented to collect light emissions from plasma 130. Interface 142 may simply be a viewport or may additionally include other optics such as lenses, mirrors and optical wavelength filters. Fiber optic cable assembly 159 may direct any collected light to spectrometer 160 for detection and conversion to digital signals. The spectrometer 160 can include a CCD sensor and convertor, such as CCD sensor 200 and convertor 250 of FIGS. 2A and 2B, for the detection and conversion. Multiple interfaces may be used separately or in parallel to collect OES related optical signals. For example, interface 141 may be located to collect emissions from near the surface of wafer 120 while interface 142 may be located to view the bulk of the plasma 130, as shown in FIG. 1.

In many semiconductor processing applications, it is common to collect both OES and IEP optical signals and this collection provides multiple problems for using spectrometer 160. Typically OES signals are continuous in time whereas IEP signals may be either/both continuous or discrete in time. The mixing of these signals causes numerous difficulties as process control often requires the detection of small changes in both the OES and IEP signals and the inherent variation in either signal can mask the observation of the changes in the other signal. It is not advantageous to support multiple spectrometers for each signal type due to, for example, cost, complexity, inconvenience of signal timing synchronization, calibration and packaging.

After detection and conversion of the received optical signals to analog electrical signals by the spectrometer 160, the analog electrical signals are typically amplified and digitized within a subsystem of spectrometer 160, and passed to signal processor 170. Signal processor 170 may be, for example, an industrial PC, PLC or other system, which employs one or more algorithms to produce output 180 such as, for example, an analog or digital control value representing the intensity of a specific wavelength or the ratio of two wavelength bands. Instead of a separate device, signal processor 170 may alternatively be integrated with spectrometer 160. The signal processor 170 may employ an OES algorithm that analyzes emission intensity signals at predetermined wavelength(s) and determines trend parameters that relate to the state of the process and can be used to access that state, for instance end point detection, etch depth, etc. For IEP applications, the signal processor 170 may employ an algorithm that analyzes wide-bandwidth portions of spectra to determine a film thickness. For example, see System and Method for In-situ Monitor and Control of Film Thickness and Trench Depth, U.S. Pat. No. 7,049,156, incorporated herein by reference. Output 180 may be transferred to process tool 110 via communication link 185 for monitoring and/or modifying the production process occurring within chamber 135 of the process tool 110.

The shown and described components of FIG. 1 are simplified for expedience and are commonly known. In addition to common functions, the spectrometer 160 or the signal processor 170 can also be configured to identify spectrally anomalous signals and process these signals according to the methods and/or features disclosed herein. As such, the spectrometer 160 or the signal processor 170 can include algorithms, processing capability, and/or logic to identify and process spectrally anomalous signals. The algorithms, processing capability, and/or logic can be in the form of hardware, software, firmware, or any combination thereof. The algorithms, processing capability, and/or logic can be within one computing device or can also be distributed over multiple devices, such as the spectrometer 160 and the signal processor 170.

Figure 2A:
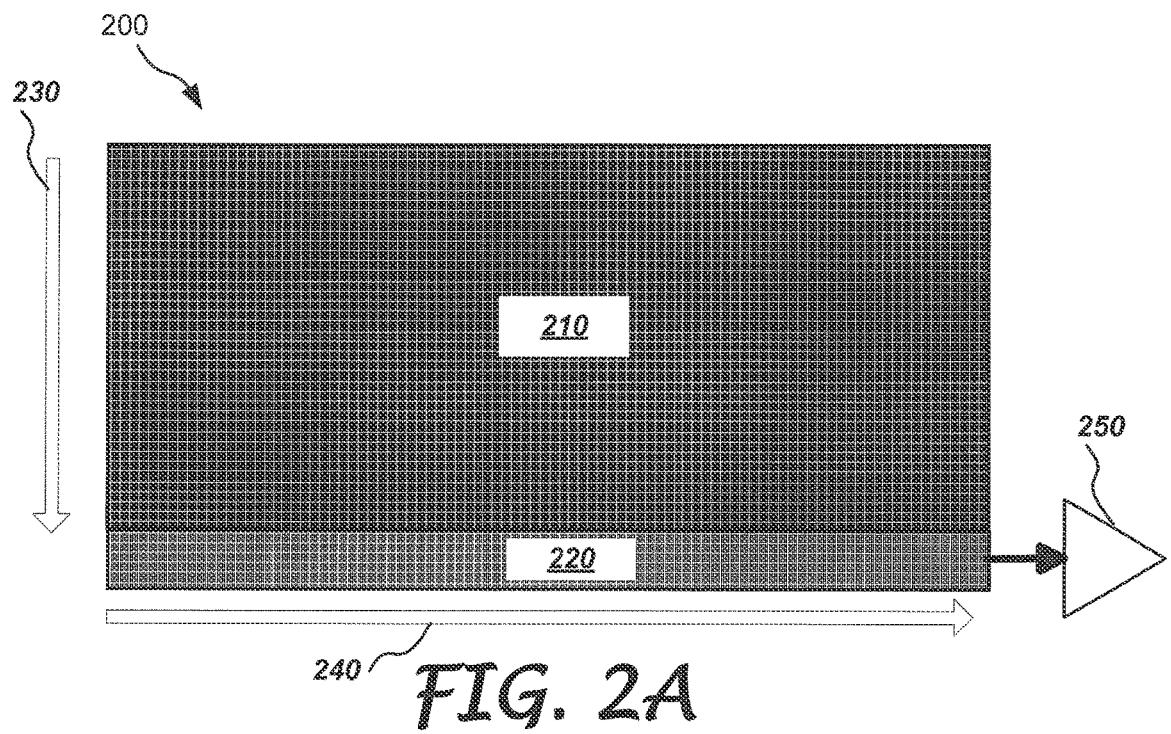
FIG. 2A is a schematic diagram which generally depicts the functional elements of a typical areal CCD sensor.

FIG. 2A is a schematic diagram which generally depicts the functional elements of conventional areal CCD sensor 200. Sensor 200 generally includes active pixel area 210 which may be divided into an array of individual pixels such as 1024 (H)×122 (V) as in the S7031 CCD sensor from Hamamatsu of Japan. As a matter of definition and clarity, it should be noted that herein the use of "horizontal" and "vertical" when addressing optical sensors respectively refer to the long and short physical axes of the optical sensor under discussion. In spectroscopy applications it is common that the long/horizontal axis of the optical sensor is aligned with the orientation of the wavelength dispersion while the short/vertical axis is associated with the imaging of a defined optical source or illuminated aperture, such as a fiber or optical slit.

Sensor 200 also includes a horizontal shift register 220 proximate to pixel area 210. Optical signals integrated upon sensor 200, such as from fiber optic cable assembly 157 or 159, are typically read via shifting the stored charge in each pixel of pixel area 210 vertically as indicated by arrow 230 into horizontal shift register 220. All or portions of active pixel area 210 may be so shifted in a row-by-row fashion. Subsequent to vertical shifting, horizontal shifts may be performed as indicated by arrow 240. As each pixel of horizontal shift register 220 is shifted (to the right in FIG. 2A) its signal content may be converted from an analog to a digital signal basis by convertor 250, e.g., analog electrical signals to digital electrical signals. Subsequent handling and processing of the resultant digital data can occur internally or externally to a spectrometer and can include averaging, curve fitting, threshold detections, filtering, other mathematical manipulations.

Figure 2B:
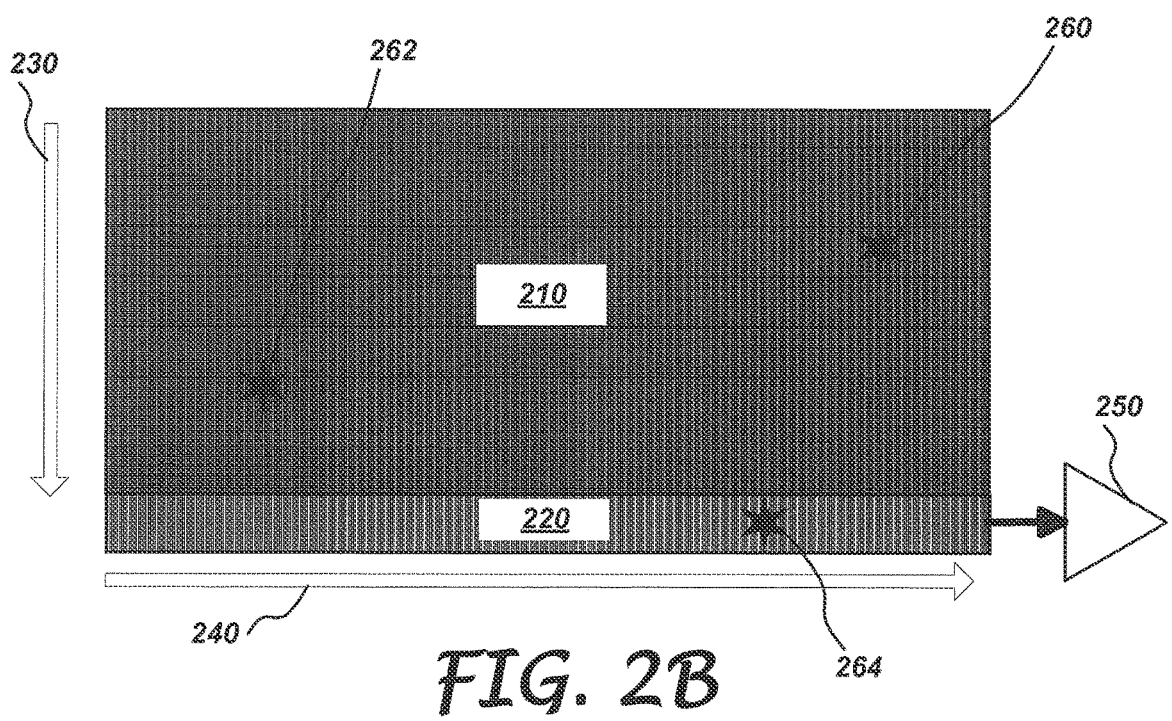
FIG. 2B is a schematic diagram of the areal CCD sensor of FIG. 2A depicting a pair of anomalous signal events superimposed over the sensing portion of the CCD pixel array and a single anomalous signal event superimposed over the shift register portion of the CCD.

In FIG. 2B, areal CCD sensor 200 of FIG. 2A is shown with a pair of anomalous signal events 260 and 262 superimposed over the sensing portion of the CCD pixel array and a single anomalous signal event 264 superimposed over the shift register portion of the CCD. An anomalous signal event is an abnormal, unexpected event resulting in an electrical signal, referred to as an anomalous signal, having a duration less than a desired number of data intervals. For example, if the sampling or collecting rate is at 1000 Hz, then the duration of the anomalous signal may be approximately less than 1 ms. Accordingly, the duration of the anomalous signal can vary in different applications. Additionally, the physical or wavelength "width" of an anomalous signal can correspond to a number of elements, such as contiguous elements, in pixel space that corresponds to physical locations on an optical sensor or in wavelength space associated with interpolated signals. For example, anomalous signal events 260 and 262 can extend through multiple contiguous pixels of proximate rows and columns, and anomalous signal event 264 can extend into multiple pixels of the same row.

Anomalous signal events 260, 262, and 264 generate anomalous signals such as described below in association with FIG. 3B. Anomalous signal events may be associated with various causes such as cosmic rays, radioactive decay, optical instabilities/disturbances, and/or electrical instabilities.

Figure 3A:
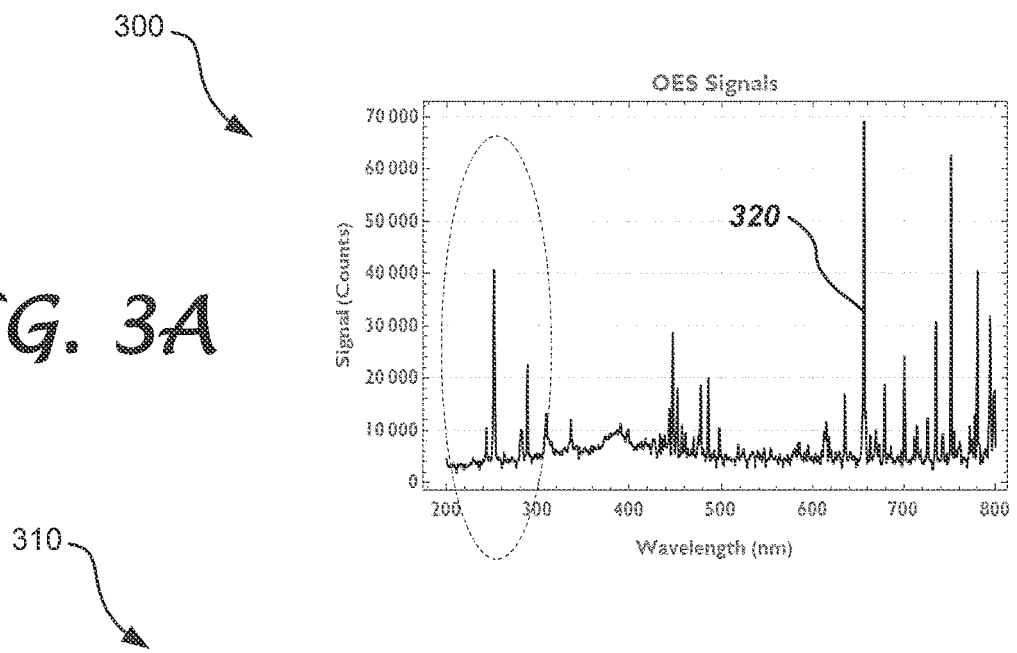
FIG. 3A is a plot of a typical OES optical signal (spectrum), in accordance with an embodiment of this disclosure.
Figure 3B:
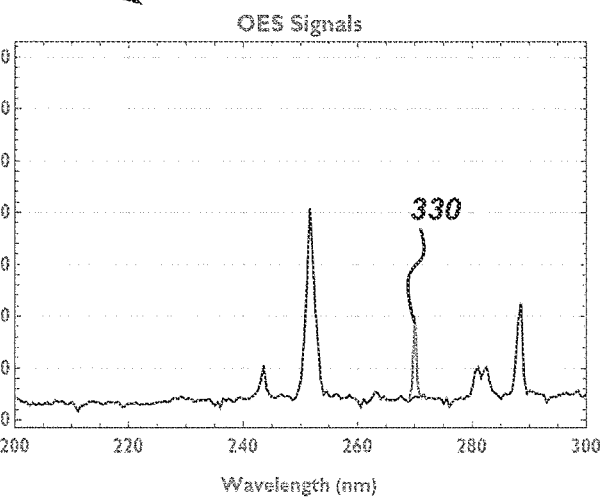
FIG. 3B is an enlarged portion of the wavelength region of the plot of FIG. 3A including a signal resulting from the occurrence of an anomalous signal event, in accordance with an embodiment of this disclosure.
Figure 3C:
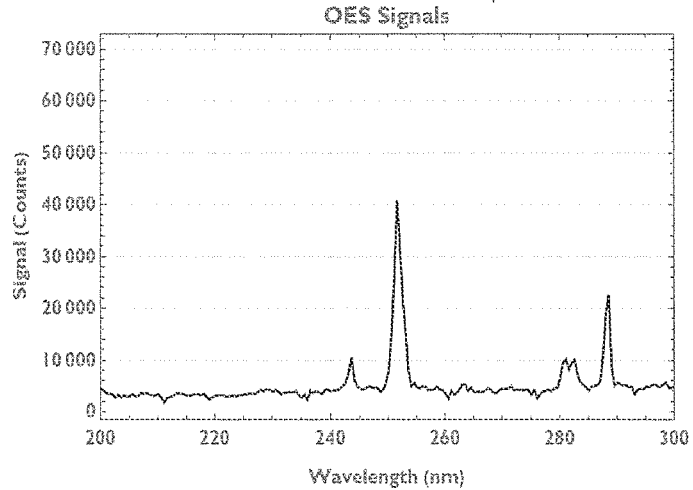
FIG. 3C is an enlarged portion of the wavelength region of the plot of FIG. 3A indicating a spectrum where an anomalous signal event does not occur, in accordance with an embodiment of this disclosure.

FIGS. 3A, 3B, and 3C provide context of an anomalous signal event and the method described herein for processing of anomalous signals. Each of FIGS. 3A, 3B, and 3C illustrates a plot of an OES signal having an x axis of wavelength and a y axis of signal counts. FIG. 3A illustrates a plot 300 of a typical OES optical signal (spectrum) 320. Spectrum 320 shows features typical of both molecular (broadband structure near 400 nm) and atomic emissions (narrow peaks throughout). FIG. 3C illustrates a plot 340 of an enlarged portion of spectrum 320 in FIG. 3A (corresponding to the dashed oval on FIG. 3A) for ease of comparison with the spectrum of FIG. 3B, which is a plot 310 of an example spectrum that includes an anomalous signal 330 near wavelengths of 270 nm. Anomalous signal 330 may be readily mis-identified as an atomic emission line and lead to incorrect processing and analysis of the OES optical signal data. Certain characteristics of anomalous signal 330 may be used to identify, characterize and correct for the occurrence of anomalous signal 330. Useful characteristics of anomalous signals include, but are not limited to, temporal and/or spatial (wavelength) frequency of occurrence, amplitude, spectral width, signal-to-noise ratio, signal aspect ratio, and duration. Anomalous signals typically have a short time duration, narrow width, i.e., width in pixel space (wavelength space), an amplitude greater than the noise level of the spectrum, and a limited number of occurrences over multiple samples. Anomalous signals differing from noise, can be identified, removed and/or mitigated in accord with these parameters. For example, a threshold may be used to identify an anomalous signal having a higher amplitude than typical noise, and temporal bracketing may also be used to identify the anomalous signals based upon their typically shorter duration, and inconsistent frequency of occurrence compared to non-anomalous features.

Figure 4:
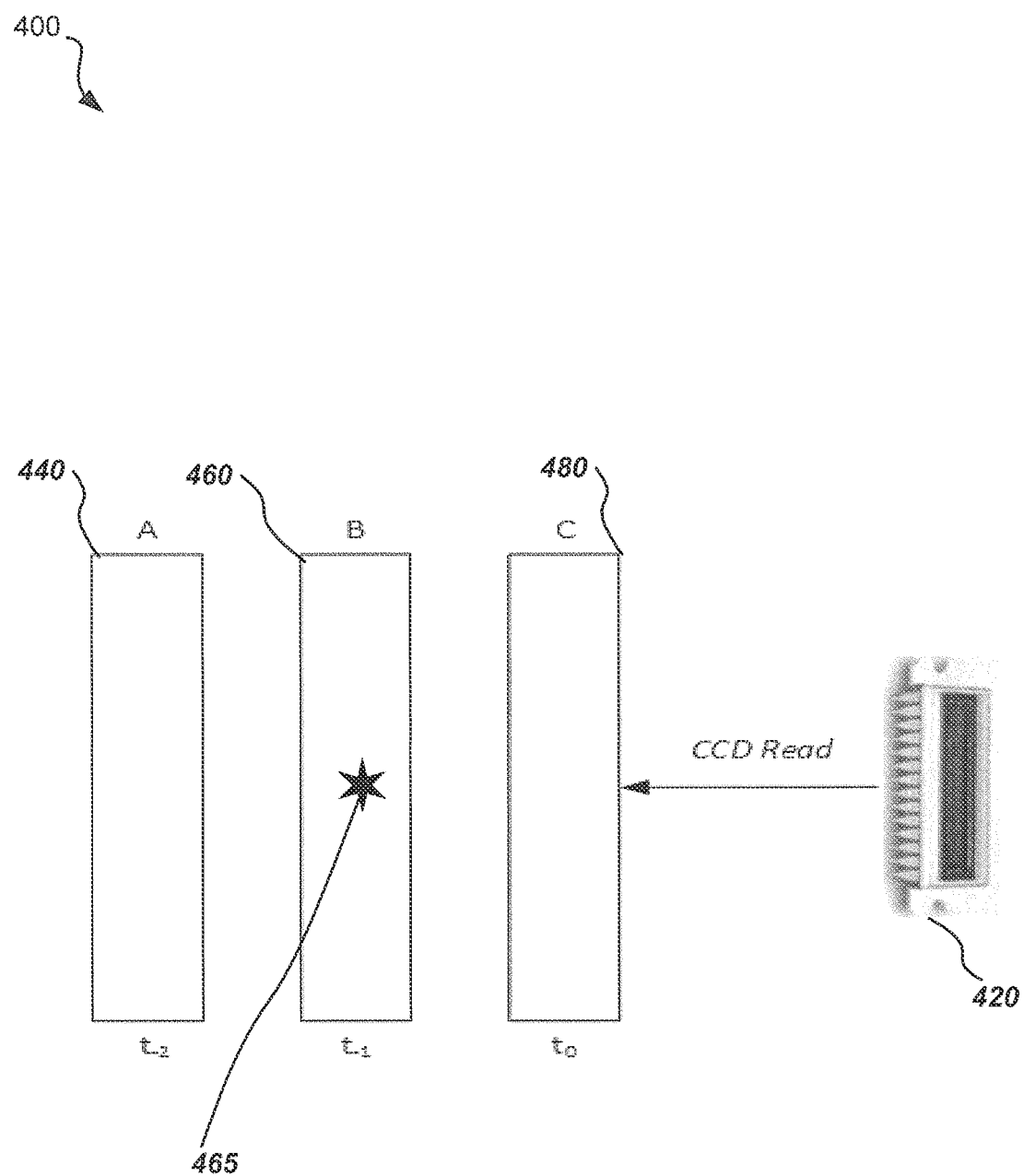
FIG. 4 is a schematic diagram which generally depicts a series of time ordered collections of spectral data from a CCD device, in accordance with an embodiment of this disclosure.

In examples discussed herein, the duration of an anomalous signal event is considered to be shorter than the time between subsequent acquisitions of spectral data from an optical sensor, such as the CCD 200 of FIG. 2A and FIG. 2B. With spectral data acquisition rates of approximately 1 to 1000 Hz, the anomalous signal event may be considered to have a duration of approximately 1000 to 1 ms. An anomalous signal may occur during any portion of a signal collection or can extend through multiple signal data collections. For example, FIG. 4 illustrates an anomalous signal 465 occurring within a single signal collection 460 but an anomalous signal could extend into multiple contiguous signal collections, such as 460 and 480, 460 and 440, or 440, 460, and 480. The coordination of spectral data collection with the duration of the anomalous signal event duration supports the use of temporal bracketing methods described herein for processing and correcting of anomalous signals. With such knowledge, anomalous signals can be advantageously bracketed and handled.

FIG. 4 shows schematic diagram 400 which generally depicts a series of time ordered collections of spectral data 440, 460, and 480 from CCD device 420. The spectral data can be spectral image data (e.g., a 2-dimensional (2-d) array) or can be binned spectral data (e.g., a 1-dimensional (1-d) array) wherein the ordered collections of spectral data 440, 460, and 480 include one or more rows of elements. For example, the binned spectral data can correspond to the output of a shift register of a CCD. The CCD device 420 can be, for example, CCD 200. Spectral data 480 is that data most recently collected from the CCD device 420, i.e., at time to. Spectral data 460 was collected from CCD device 420 at a time prior (one or more data acquisition periods) to that of spectral data 480, i.e., at time ti. As indicated, spectral data 440 was collected from CCD device 420 at a time prior (one or more data acquisition periods) to that of spectral data 460, i.e., at time $t_{-2}$. Spectral data 460 includes at least one anomalous signal 465 from an anomalous signal event which was sufficiently contemporaneous with the collection of spectral data 460 to occur only within spectral data 460 and does not occur within spectral data 440 nor spectral data 480. The anomalous signal 465 can be, for example, from one of the anomalous signal events 260, 262, 264, of FIG. 2B. Spectral data 440 and 480 may be, for example, associated with the spectrum of FIG. 3C and spectral data 460 may be, for example, associated with the spectrum of FIG. 3B. Spectral data 440, 460 and 480 may be digitally represented as, for example, a 1024 or 2048 element array of unsigned 16-bit values. Anomalous signals may reside within some number, such as one, two, or five, of the elements of a 1-d array or some n×m number of elements of a 2-d array. Spectral data 440, 460 and 480 may reside in digital forms within one or more components of an optical instrument, such as spectrometer 160 of FIG. 1.

Figure 5:
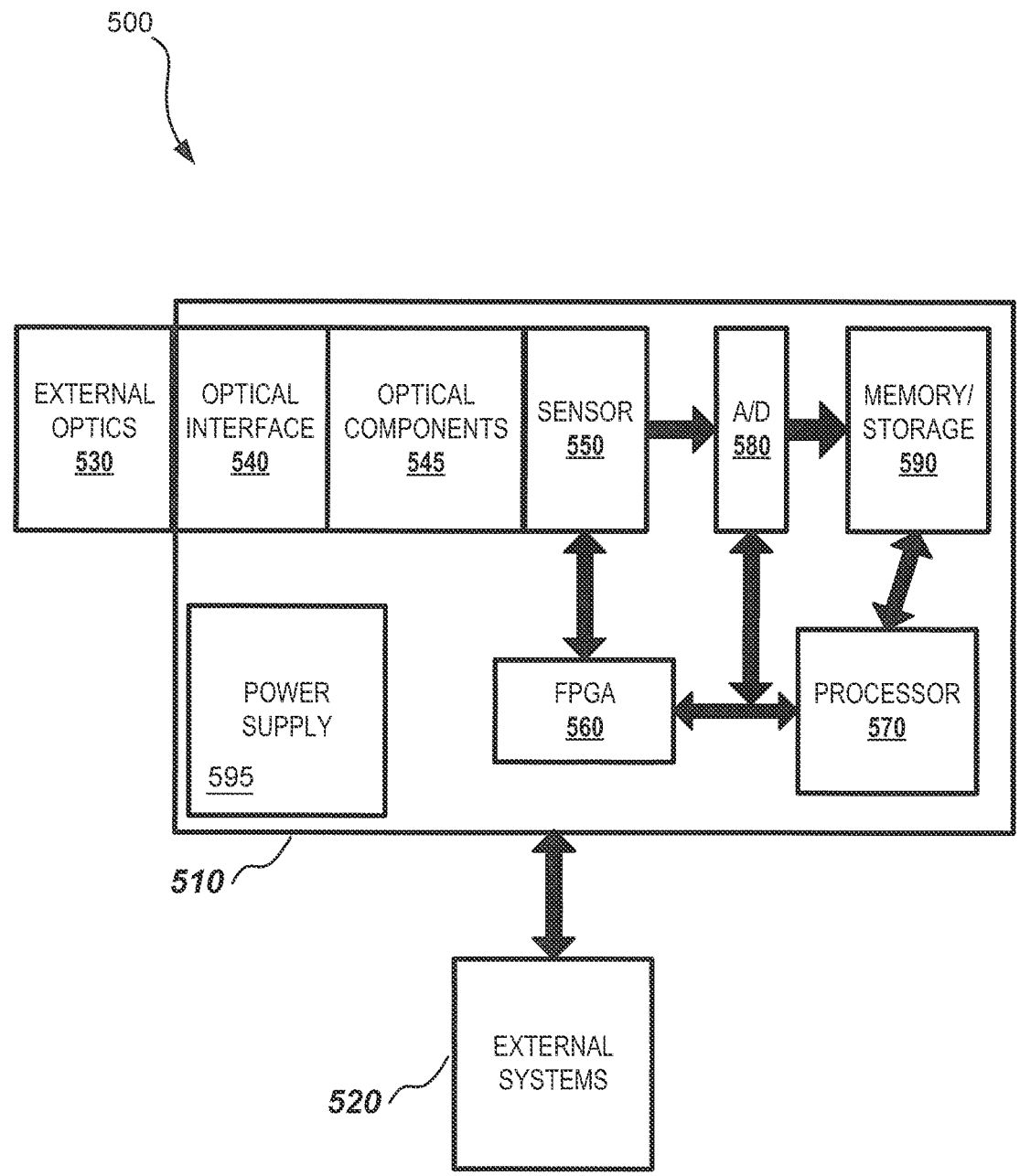
FIG. 5 is block diagram of a spectrometer and specific related systems, in accordance with an embodiment of this disclosure.

FIG. 5 is a block diagram of an optical system 500 including a spectrometer 510 and specific related systems, in accordance with one embodiment of this disclosure. Spectrometer 510 may incorporate the system, features, and methods disclosed herein to the advantage of measurement of optical signals from semiconductor processes and may be associated with spectrometer 160 of FIG. 1. Spectrometer 510 may receive optical signals from external optics 530, such as via fiber optic cable assemblies 157 or 159, and may, following integration and conversion, send data to external systems 520, such as output 180 of FIG. 1, which may also be used to control spectrometer 510 by, for example, selecting a mode of operation or controlling integration timing as defined herein. Spectrometer 510 may include optical interface 540 such as a subminiature assembly (SMA) or ferrule connector (FC) fiber optic connector or other opto-mechanical interface. Further optical components 545 such as slits, lenses, filters and gratings may act to form, guide and chromatically separate the received optical signals and direct them to sensor 550 for integration and conversion. Sensor 550 may be associated with sensor 200 of FIG. 2 or CCD device 420 of FIG. 4. Low-level functions of sensor 550 may be controlled by elements such as FPGA 560 and processor 570. Following optical to electrical conversion, analog signals may be directed to A/D convertor 580 and converted from electrical analog signals to electrical digital signals which may then be stored in memory 590 for immediate or later use and transmission, such as to external systems 520 (c.f., signal processor 170 of FIG. 1). Although certain interfaces and relationships are indicated by arrows, not all interactions and control relations are indicated in FIG. 5. Spectral data 440, 460 and 480 of FIG. 4 may be, for example, collected, stored and/or acted upon, according to the processes and examples illustrated by FIG. 6 thru FIG. 13 within/by one or multiple of memory/storage 590, FPGA 560, processor 570 and/or external systems 520. Spectrometer 510 also includes a power supply 595, which can be a conventional AC or DC power supply typically included with spectrometers.

Figure 6:
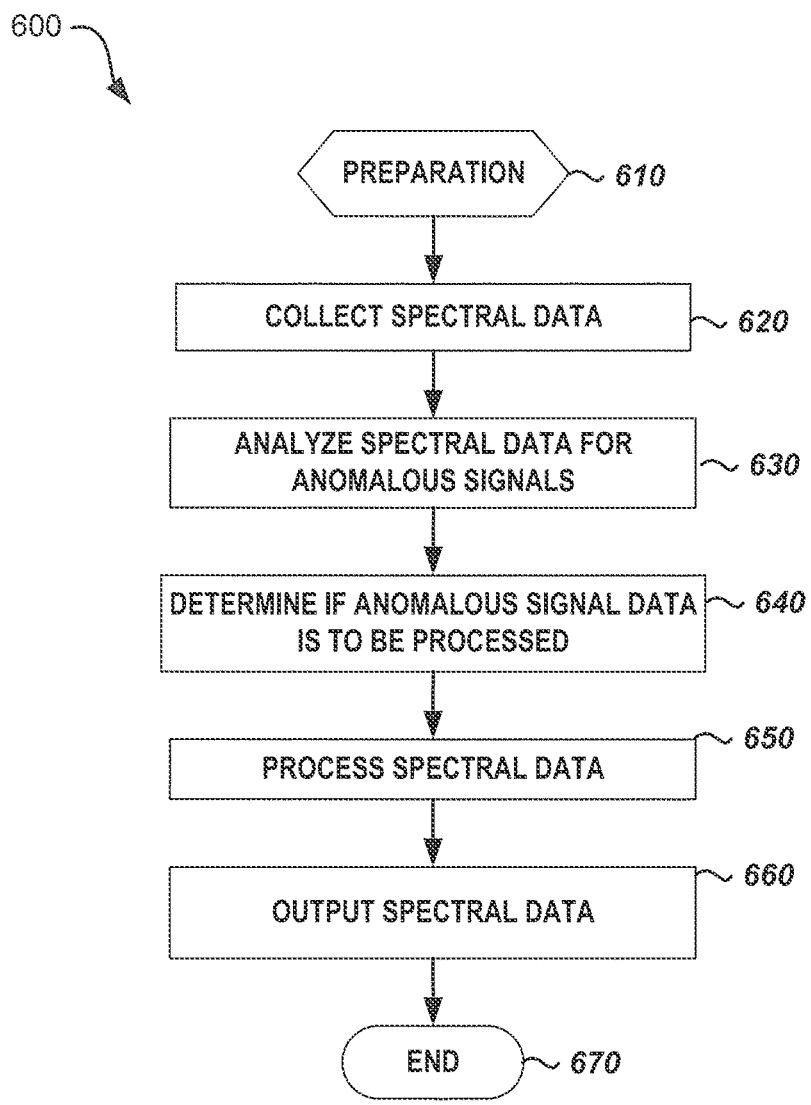
FIG. 6 is a flow chart for a method of reading spectral data from a CCD device and processing the spectral data to modify signals resulting from the occurrence of an anomalous signal event, in accordance with an embodiment of this disclosure.

FIG. 6 is a flow chart for a method 600 of collecting spectral data from an optical sensor, such as a CCD device including CCD sensor 200 or 420 as examples, and processing the spectral data to identify and process anomalous signals resulting from an occurrence of an anomalous signal event. One or more steps of the process 600 can correspond to an algorithm that is represented by software that directs the operation of one or more processors, such as signal processor 170 or a processor or FPGA of the spectrometer 160 or spectrometer 510 of FIGS. 1 and 5, respectively. Method 600 begins with a preparation step 610 wherein any preliminary actions may be performed. The preliminary actions may include predetermination of spectral data collection rates, establishment of anomalous signal classification metrics and anomalous signal correction parameters. Next, in step 620 spectral data may be collected. According to further processing details described with respect to FIG. 7 (generally identification of anomalous signals) and FIG. 8 (generally, modifying anomalous signals), one or more sets of spectral data may be collected to establish appropriate process sequencing.

Next, in step 630, collected spectral data may be analyzed to identify and classify anomalous signals, if any exists with the collected spectral data. When anomalous signals are identified, a determination is made in step 640 to process the anomalous signals or perform a different action, such as do nothing. At least a portion of steps 630 and 640 can be performed according to process 700 of FIG. 7. Processing of the anomalous signals is performed in step 650 wherein the spectral data is processed. At least a portion of step 650 can be performed such as in process 800 of FIG. 8. Processing may include removing, modifying, reducing in magnitude, etc. an anomalous signal. Doing nothing may be appropriate based on the number of elements of the spectral data that have an anomalous signal. As such, a spatially/wavelength extended signal that is identified as a possible anomalous signal may indicate a non-anomalous event. Additionally, a possible anomalous signal having a long time duration may not be an anomalous signal but may indicate another type of change, such as a baseline shift in the processing chamber. Accordingly, modifying such signals could mask the change and inhibit appropriate identification of a non-anomalous signal. Next, in step 660, spectral data may be output to another device or system, such as process tool 110 or external systems 520. Steps 620 through 660 may be repeated for any number of collections of spectral data. Method 600 ends, in step 670, when all collected spectral data has been processed.

Figure 7:
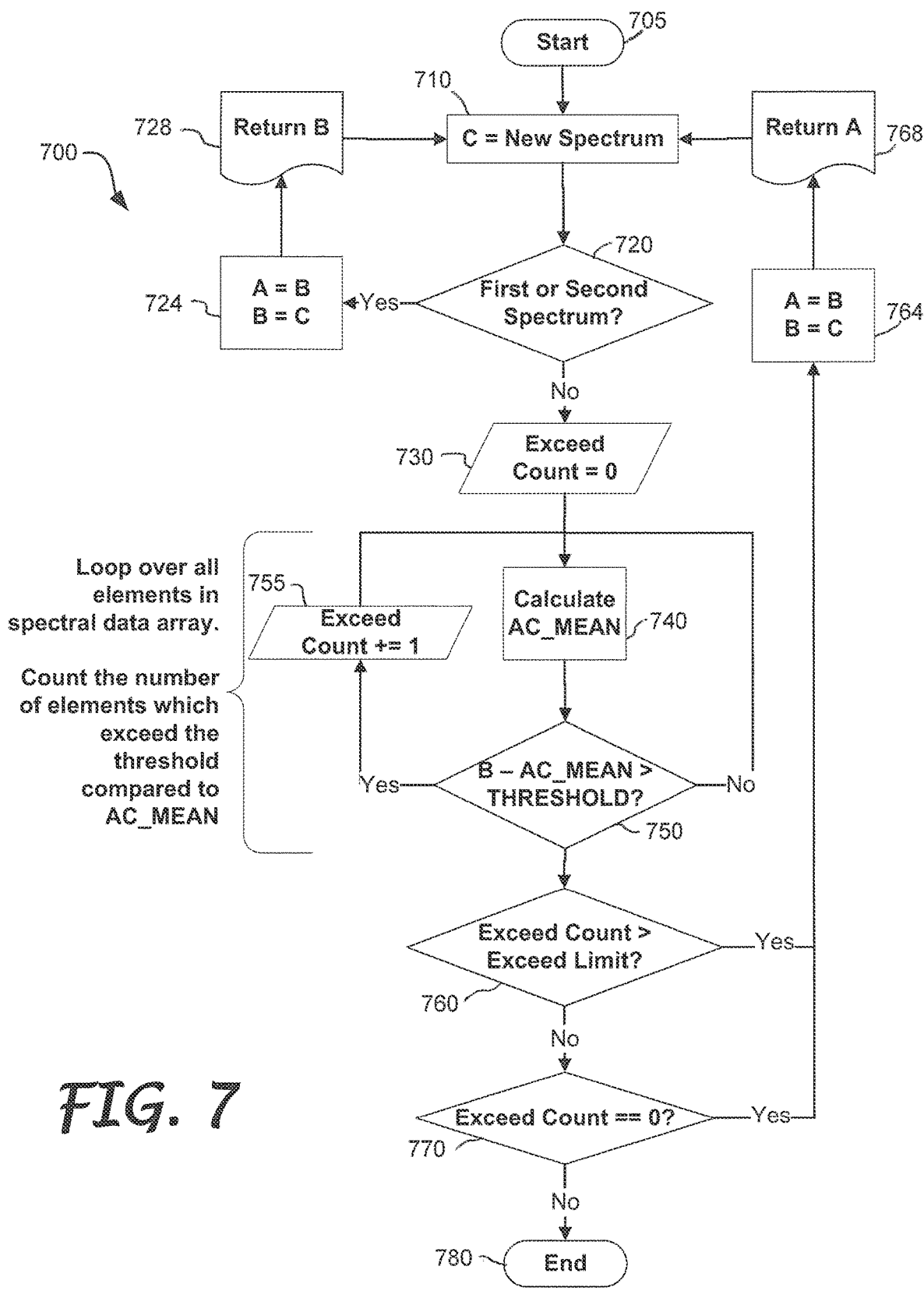
FIG. 7 is a flow chart detailing various steps of the method of FIG. 6, in accordance with an embodiment of this disclosure.

FIG. 7 is a flow chart of process 700 detailing various steps of the method of FIG. 6. One or more steps of the process 700 can correspond to an algorithm that is represented by software that directs the operation of one or more processors, such as signal processor 170 or a processor or FPGA of the spectrometer 160 or spectrometer 510. Process 700 outlines the collection of spectral data, such as in step 620, and the identification of individual elements of the spectral data array that may include anomalous signals, such as in step 630. Process 700 may be utilized with other spectral data processing or analysis such as offset/gain adjustment, radiometric correction, and wavelength resampling from pixel-space to wavelength-space. Process 700 starts with the collection of spectral data in step 705. In this example process, spectral data arrays identified by indices A, B and C are associated with time-ordering of the collected spectral data where C is the most recently collected spectral data, A is the oldest collected spectral data and B is spectral data collected intermediate to A and C as described in association with the series of time ordered collections of spectral data 440, 460, and 480 represented in FIG. 4. In various examples, the contents of spectral data arrays A, B and C prior to the start of process 700 are not significant. In examples described herein, process 700 may collect three sets of spectral data prior to analyzing the collected spectral data for anomalous signals. During initial and subsequent collections, spectral data and/or associated indices (e.g. A, B, C) may be rotated/shifting according to steps outlined in FIG. 7. Spectral data arrays may be of the appropriate size (number of elements) and data type suitable for the data derived from a CCD device. For example, a 1024 or 2048 element array depending on the physical configuration of the CCD for 1-d binned data.

In step 710, the newest collected spectrum data is defined as C. A determination is then made in step 720 if the newest collected spectrum data is the first or second collected data. If yes, then process 700 continues to step 724 where spectral data array A is set to spectral data array B and spectral data array B is set to spectral data array C. Spectral data array B is then returned for further use, such as for output according to step 660 of FIG. 6, in step 728 and the method 700 continues to step 710. The loop of 710, 720, 724 and 728 is repeated to obtain three spectral data arrays for bracketing of a single spectral data array for analysis, which in this example is spectral data array B. For this example, where three collected spectra are used for subsequent processing, process 700 returns/outputs the most recent spectrum (associated with index B after step 724) until the third spectrum is collected. The process 700 continues to step 730 where an internal counter for "Exceed Count" is set to zero. Exceed Count, also referred to herein as "width count value" or simply "width count", is a parameter that is used to identify anomalous signals and determine the difference between an anomalous signal and a non-anomalous signal (a proper data state change) by determining the spatial/wavelength width of a signal by accumulating the number of elements of the spectral data array subject to the conditions posed by step 750.

At this point in process 700 three spectral data arrays A, B, and C have been collected and are analyzed to determine if spectral data array B contains an anomalous signal based on the width count and a "Threshold", which is also referred to herein as an "intensity threshold value" or simply "intensity threshold". Process 700, therefore, uses a two dimensional identification process, wherein the intensity threshold and an "Exceed Limit", also referred to herein a "width count limit", are used to determine if both the height (signal counts/intensity) and the spatial/wavelength width of a signal are within a defined range of an anomalous signal. As noted in FIG. 700, steps 740, 750, and 755 are repeated for all elements in the spectral data arrays, such as 1024 or 2048 times where 'i' is the element index of the spectral data arrays.

In step 740, the mean of spectral data arrays A and C is determined. "AC_mean" can be calculated by multiplying the sum of the elements by 0.5, i.e., $0.5*(A_i+C_i)$. AC_mean may be represented digitally by an array object of equivalent size to the size of the spectral data arrays (e.g., 1024 or 2048 elements). Anomalous signals are partially identified in step 750. A possible anomalous signal may be identified by comparing the spectral data of the three most recent collections, for example, in an element-by-element manner by calculation of the quantity: $B_i-0.5*(A_i-C_i)>$intensity threshold, where the intensity threshold is a configurable parameter of process 700. Intensity threshold is, generally, a value corresponding to the number of counts or intensity of spectral data that an anomalous signal may be above a reference value (e.g., AC_Mean) and may be defined, at least, with respect to the noise level, dynamic range and other metrics of expected anomalous and non-anomalous signals. The intensity threshold can be preset before monitoring a process or receiving spectral data. The intensity threshold can also be dynamically set or adjusted based on calculation of metrics from spectral data that is being actively received.

If a possible anomalous signal is identified in step 750, via the threshold operation, the process continues to step 755 where the width count (denoted as Exceed Count in FIG. 7) is incremented one and indicates the anomalous event associated with the possible anomalous signal extends to a width count number of elements of the collected data. The process 700 then continues to step 740 where the next element is analyzed. If a possible anomalous signal is not identified in step 750, the process 700 continues to step 740 without increasing the width count. Once all of the elements of spectral data arrays are processed, the loop of steps 740, 750, and 755 is complete and process 700 continues to step 760.

In step 760 a determination is made if the width count is greater than a width count limit. In general, width count being greater than width count limit indicates a possible anomalous signal that is spectrally wider than expected anomalous signals and is therefore processed as a non-anomalous signal. If so, process 700 continues to step 764 where spectral data array A is set to spectral data array B and spectral data array B is set to spectral data array C. Process 700 then continues to step 768 where spectral data array A is returned. Process 700 then continues to step 710 for acquisition of a new spectral data array for analysis.

Returning to step 760, if the width count is not greater than the width count limit, then process 700 continues to step 770 where a determination is made if the width count equals zero. In general, when the width count equals zero indicates that no possible anomalous signal was detected during the threshold comparison of steps 740, 750, and 755. If so, process continues to step 764. If not, the possible anomalous signal identified in step 750 is identified as an anomalous signal based on the two dimensional identification process of process 700, which continues to step 780 and ends.

According to process 700, spectral data array elements thus identified as having possible anomalous values may be counted and be subject to further classification criteria. For example, according to the configurable width count parameter of process 700, if a large number of elements with possible anomalous values are identified within the spectral data array B, the possible anomalous elements and their associated values may be recharacterized as non-anomalous in the case that anomalous signals are defined to be "spectrally narrow" according to anomalous signal classification metrics and/or anomalous signal correction parameters, or be existent within a small number of elements of the spectral data arrays A, B, C. Other criteria on the number or relationship between anomalous elements may be used for useful classification, such as whether they occur contiguously within the spectral data arrays A, B, C. Criteria may be predetermined prior to spectral data collection or may be determined during runtime operation via analysis of collected spectra data.

Figure 8:
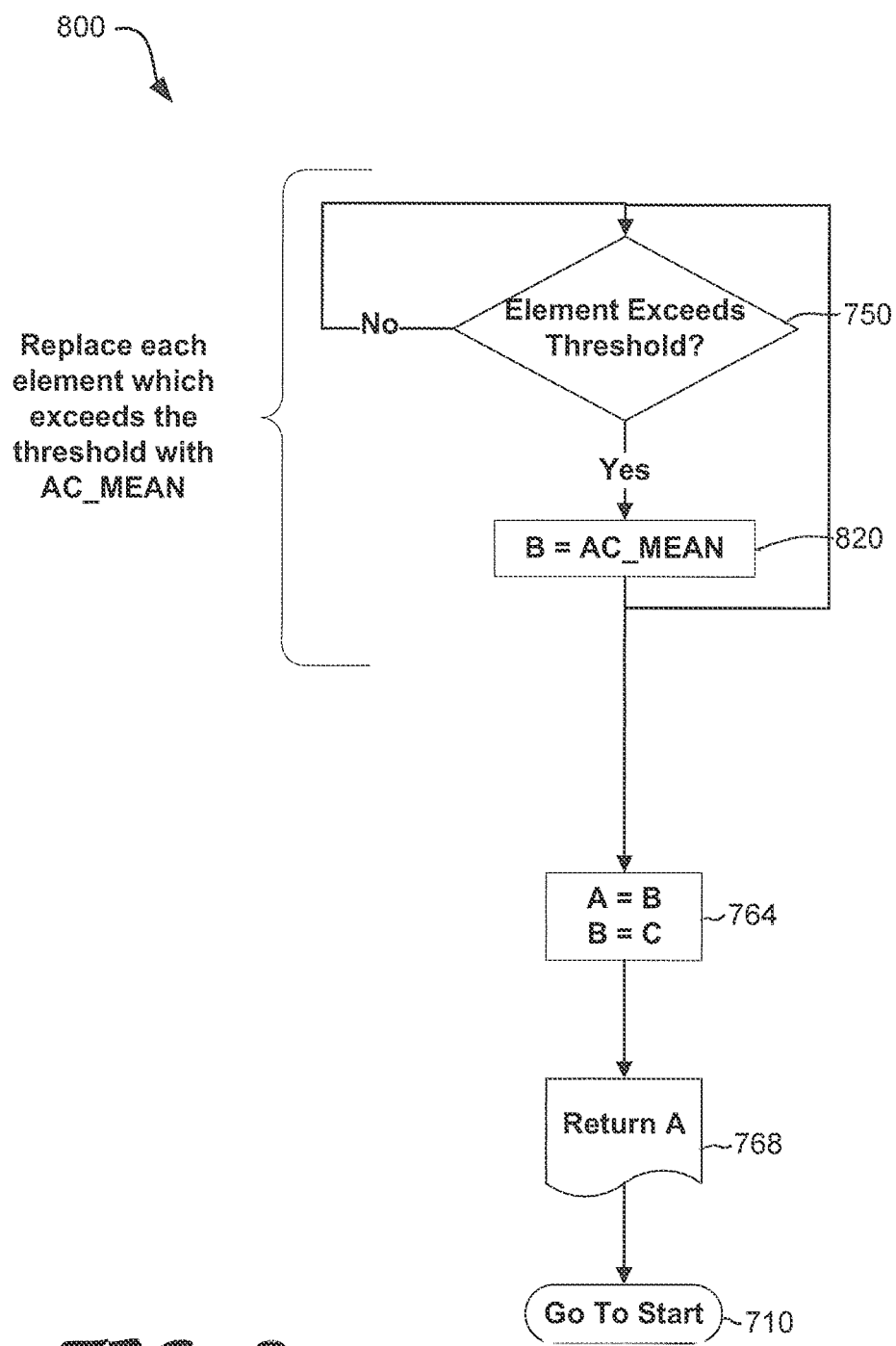
FIG. 8 is a second flow chart detailing various steps of the method of FIG. 6, in accordance with an embodiment of this disclosure.

Generally, during processing, spectral data array B may be altered to remove or adjust anomalous signal data identified by, for example, process 700. FIG. 8 illustrates a flow diagram of an example of a process 800 for modifying anomalous signal data according to the principles of the disclosure. One or more steps of the process 800 can correspond to an algorithm that is represented by software that directs the operation of one or more processors, such as signal processor 170 or a processor or FPGA of the spectrometer 160 or spectrometer 510. Process 800 may be associated with steps of process 700 as examples of how the processes 700 and 800 can cooperate to identify and modify anomalous signals. For example, each element of the spectral data array B previously identified by process 700 to include an anomalous value in step 750 may have its value $B_i$ changed to AC_MEAN, in step 820, where AC_MEAN=$0.5*(A_i+C_i)$. In general, process 800 may be enacted between steps 770 and 780 of process 700. In one embodiment not shown in FIG. 8, but expressed in examples of FIGS. 9-13, a contiguous set of elements centered on each element associated with anomalous values may be changed to the corresponding AC_MEAN value. Prior to outputting the data to subsequent systems or processing, spectral data and/or associated indices (e.g. A, B, C) may be rotated/shifting according to steps of process 700 outlined in FIG. 8 in order to accommodate a new collection of spectral data from a device such as CCD device 420. It should be noted that the processing of collected spectral data according to processes 600, 700 and 800 results in a signal lag of one collection period. Other processing methodologies may result in greater or lesser signal lag conditions.

Process 700 provides an example of identifying anomalous signals and process 800 provides an example modifying anomalous signals. In one embodiment, only elements of anomalous signals which exceed the intensity threshold as compared to AC_MEAN=$0.5*(A_i+C_i)$ such as in step 750 may be modified. Additional elements proximate those identified as above the intensity threshold may also be modified to ensure appropriate modification of portions of an anomalous signal that may not be above the intensity threshold. Review of examples presented in FIGS. 9-12 show that additional elements with lower and higher element indices, regardless of their element values, may be modified. The number of proximate elements so modified may be according to anomalous signal classification metrics and/or anomalous signal correction parameters. The number of proximate elements to modify can be fixed or have a variable range. For example, 1 to 5 elements with lower and higher element indices may be modified. FIG. 10 provides an example where the signal count at element 1554 exceeds the intensity threshold parameter and is modified. Additionally, the signal counts of two elements (1552, 1553, and 1555, 1556) on each side of element 1554 are modified. In this particular example, the modified signal count and the received signal count at element 1552 are essentially the same. In other words, the signal count at element 1552 remains effectively the same since the anomalous signal event did not produce significant variation in the signal count value of this element. Various intensity threshold values were used in the examples seen in FIGS. 9-12. For example, FIG. 12 provides an example of an intensity threshold that is between approximately 200 counts to 2000 counts.

Accordingly, FIGS. 9-13 are examples of spectral data processed to identify and modify anomalous signals resulting from occurrences of anomalous signal events. The spectral data can be processed according to one or more of steps of the processes 600, 700, and 800 as discussed herein. In each of FIGS. 9-12, spectral data is represented by three spectral data arrays A, B, and C, that have been collected via, for example a CCD device as shown in FIG. 4. Additionally, FIGS. 9-12 include a detailed image of spectral data array B that includes the original spectral data with existing anomalous signals and corrected spectral data represented by a "corrected" signal trace. In each FIGS. 9-12, plotted anomalous signals include one or more dots at the location of an element value corresponding to the anomalous signal detected above the intensity threshold according to processing per step 750 of process 700. As evident in the detailed images of spectral data array B, the dots are located at vertices that correspond to discrete sample points of the signals.

Figure 9:
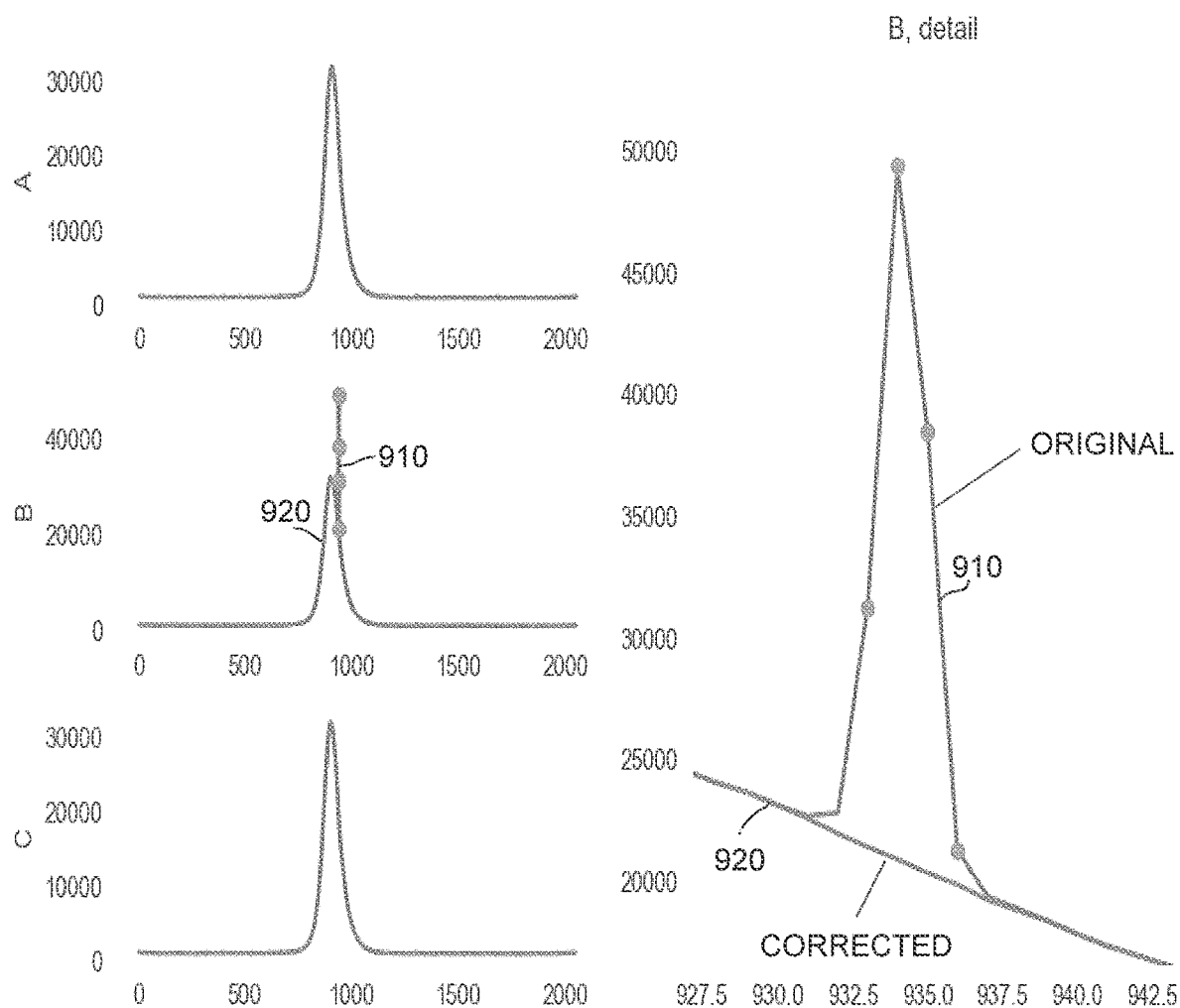
FIGS. 9-13 are examples of spectral data processed to modify signals resulting from occurrences of anomalous signal events, in accordance with an embodiment of this disclosure.
Figure 10:
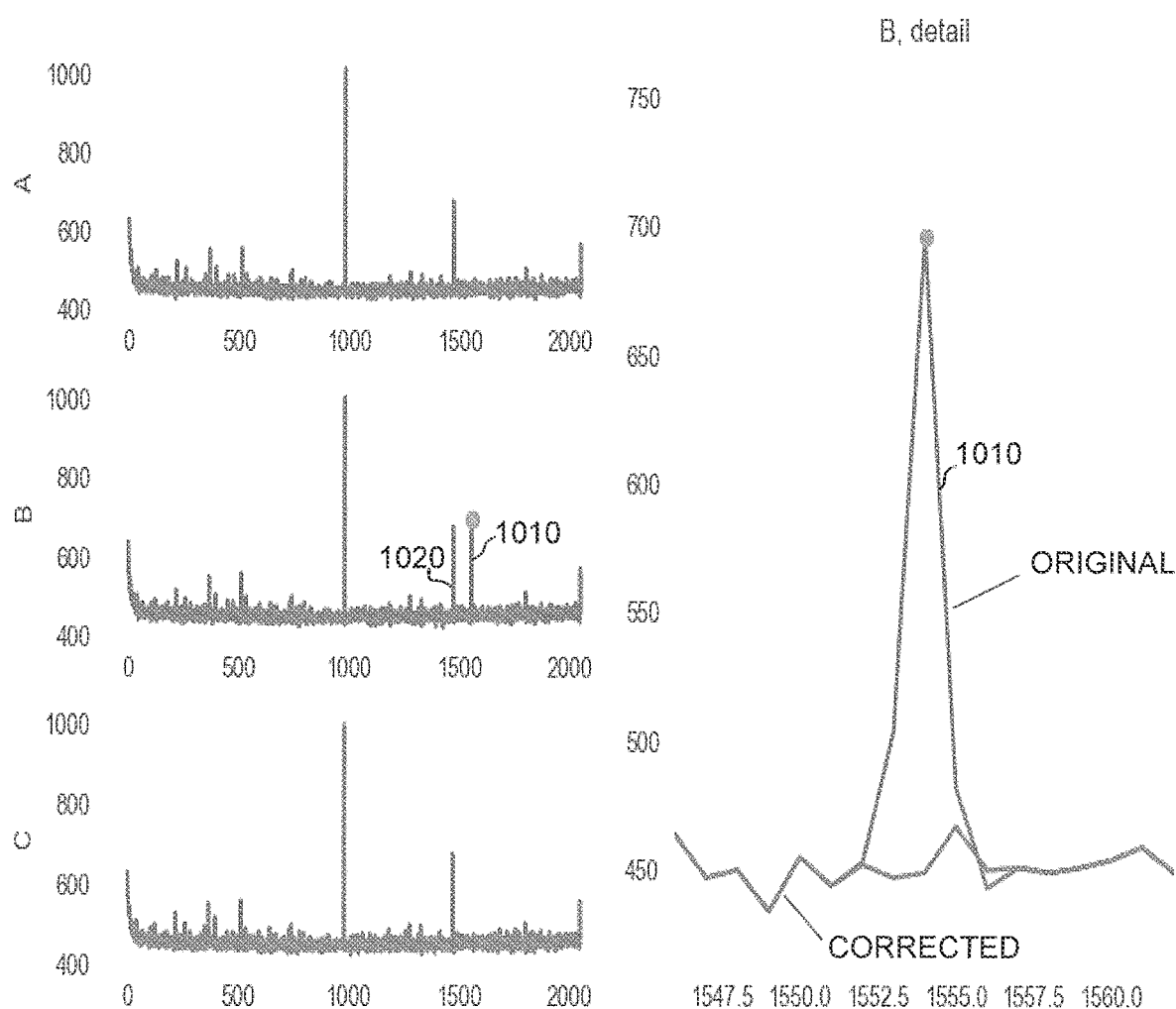

In FIG. 9, an anomalous signal 910 spanning four elements (represented by the four dots) of the spectral data array B has been identified for correction. The anomalous signal 910 is spectrally coincident with a "real" spectral feature 920, which may be defined as a generally expected and persistent feature (atomic emission line, molecular emission line, broadband emission, etc.) that has a temporal duration greater than a few data intervals. Anomalous signal 910 is observed to occur with short temporal duration only within data array B whereas the underlying feature 920 is observed to occur with longer temporal duration within data arrays A, B and C. Identification and correction of the anomalous signal 910 in this example is done in so-called "pixel-space" wherein the spectral data array B is associated with the physical pixel elements of the CCD device. In this case, the spectral data is from a device with 2048 pixel elements and the anomalous signal 910 is identified in elements 933 through 936 of the CCD device. Identification and correction of the anomalous signal 910 may also be performed within so-called "wavelength-space", which is a remapping of the "pixel-space" spectral data to a wavelength domain with regular intervals such as, for example, 0.25 or 0.5 nm. Identification and correction of the anomalous signal data in "pixel-space" may limit the complications due to spectral signal data interpolation and may be performed at lower operational cost within embedded processors within spectrometer 500 of FIG. 5.

In FIG. 10, an anomalous signal 1010 spanning one element of the spectral data array B has been identified and corrected. The anomalous signal 1010 is readily differentiated from similarly narrow "real" spectral features, such as 1020, due to the use of the time-domain processing according to the methods described above. It should be noted that existent processing methods (z-scoring, moving median filter, etc.) often operate across the wavelength-domain (one spectral data array at a time) and not the temporal domain, and would therefore have considerably difficulty in differentiating the anomalous signal 1010 from similarly spectrally shaped "real" features. Comparison of the named "original" and "corrected" data shows that in addition to the single element (indicated by a dot at the location of the element value) identified according to the established criteria at least three additional proximate elements (not indicated by dots) are also corrected. The number of elements outside of those identified by process 700 which may be corrected may be controlled via an additional adjustable proximity or adjacency parameter (e.g., correct two additional elements to each side of the elements identified to include an anomalous signal above an intensity threshold). The adjacency parameter, as with the intensity threshold and the width count limit, are parameters than can be input by a user for the identifying and processing functions. Each one of the three parameters can be predetermined before the identifying and/or processing or can be dynamically set/changed during the identifying and/or processing of anomalous signals.

Figure 11:
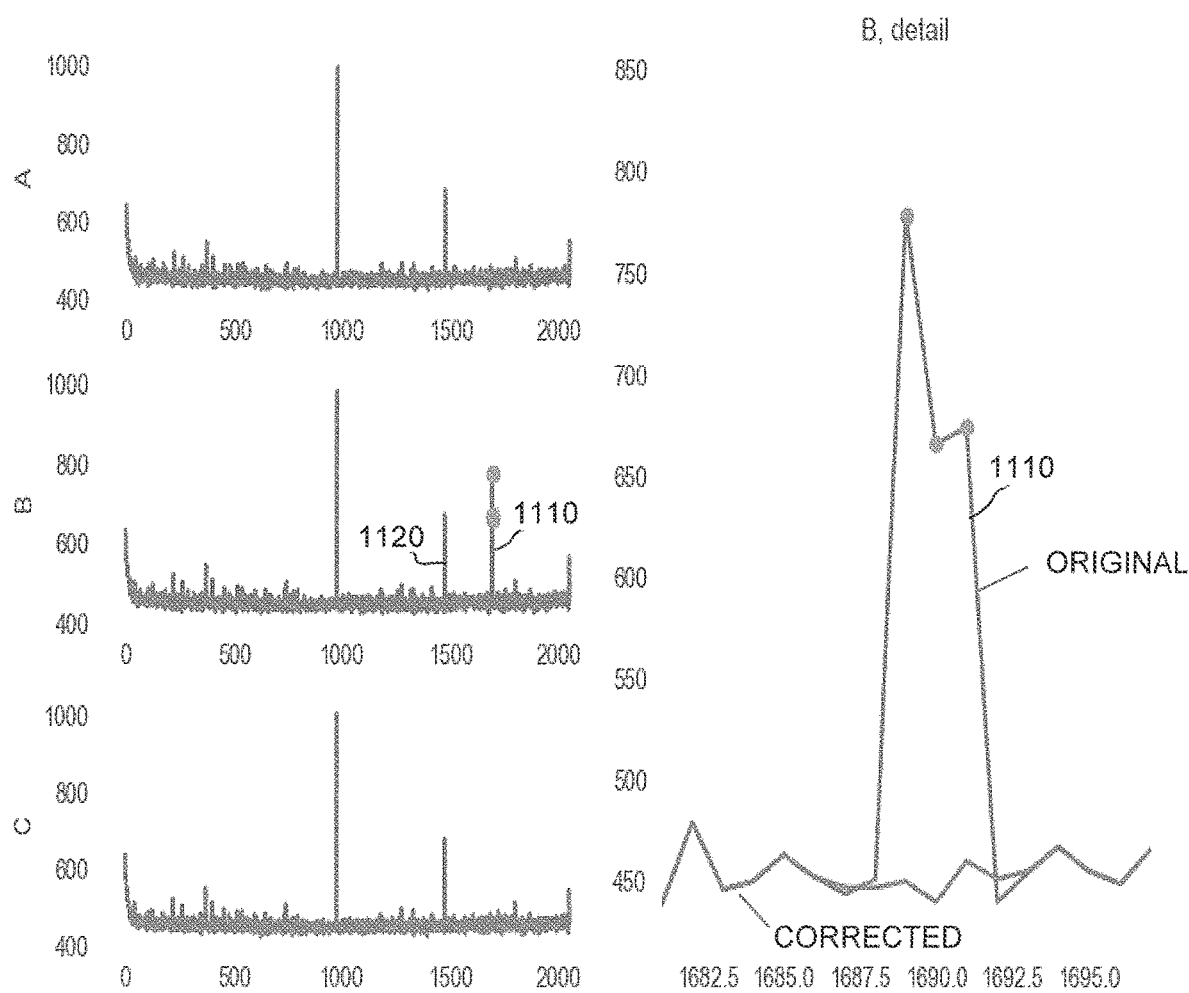
Figure 12:
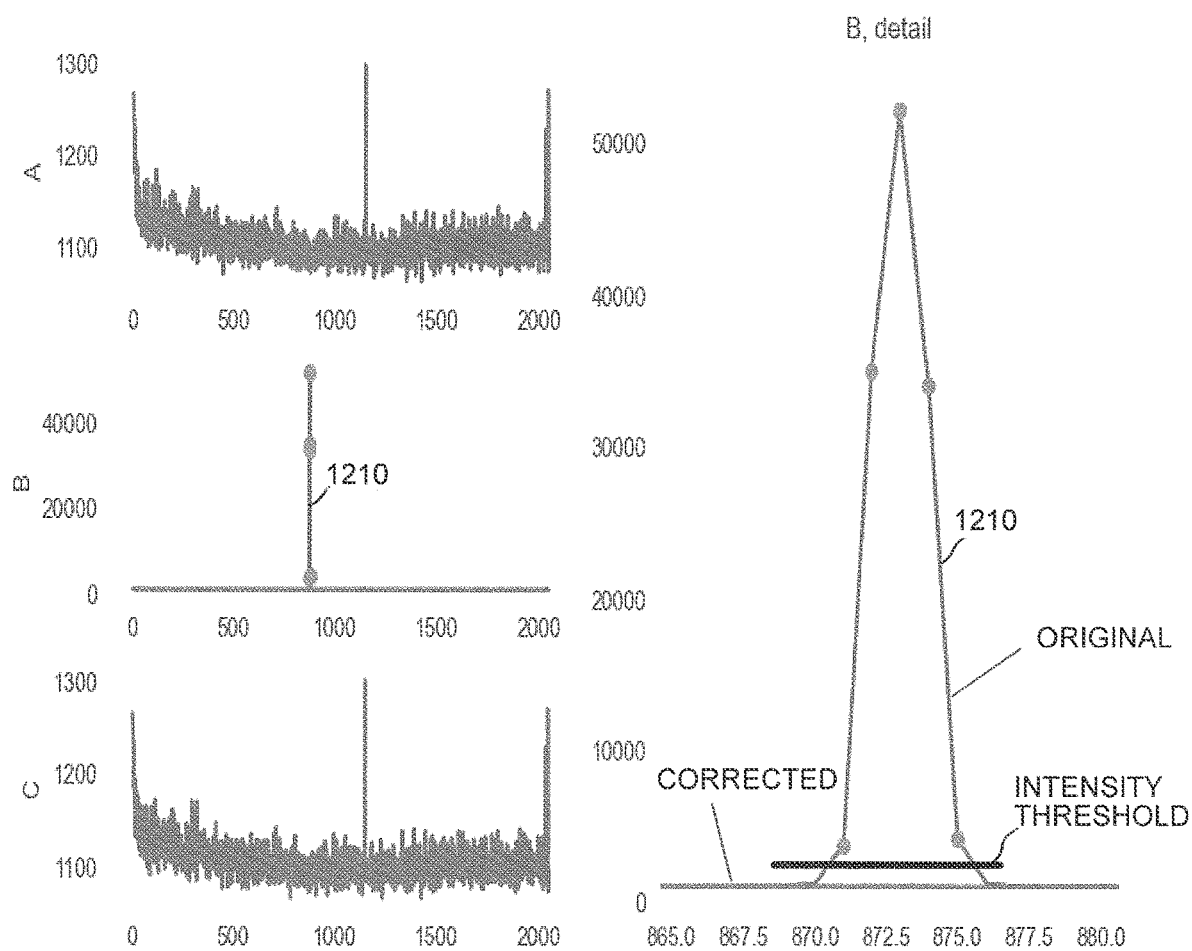

In FIG. 11, an anomalous signal 1110 spanning three elements of the spectral data array B has been identified and corrected as represented by the corrected data. The anomalous signal 1110 is readily differentiated from similarly narrow "real" spectral features, such as 1120, due to the use of the time-domain processing according to the methods described above. The asymmetry of the anomalous signal 1110 does not adversely influence the identification and correction.

In FIG. 12, a large anomalous signal 1210 spanning five elements of the spectral data array B has been identified and corrected. The anomalous signal 1210 is readily differentiated from similarly narrow "real" spectral features and spectral signal noise due to the use of the time-domain and threshold processing according to the methods described above. The amplitude of the anomalous signal data does not adversely influence the identification and correction but leads to less difficult classification above the noise floor.

Figure 13:
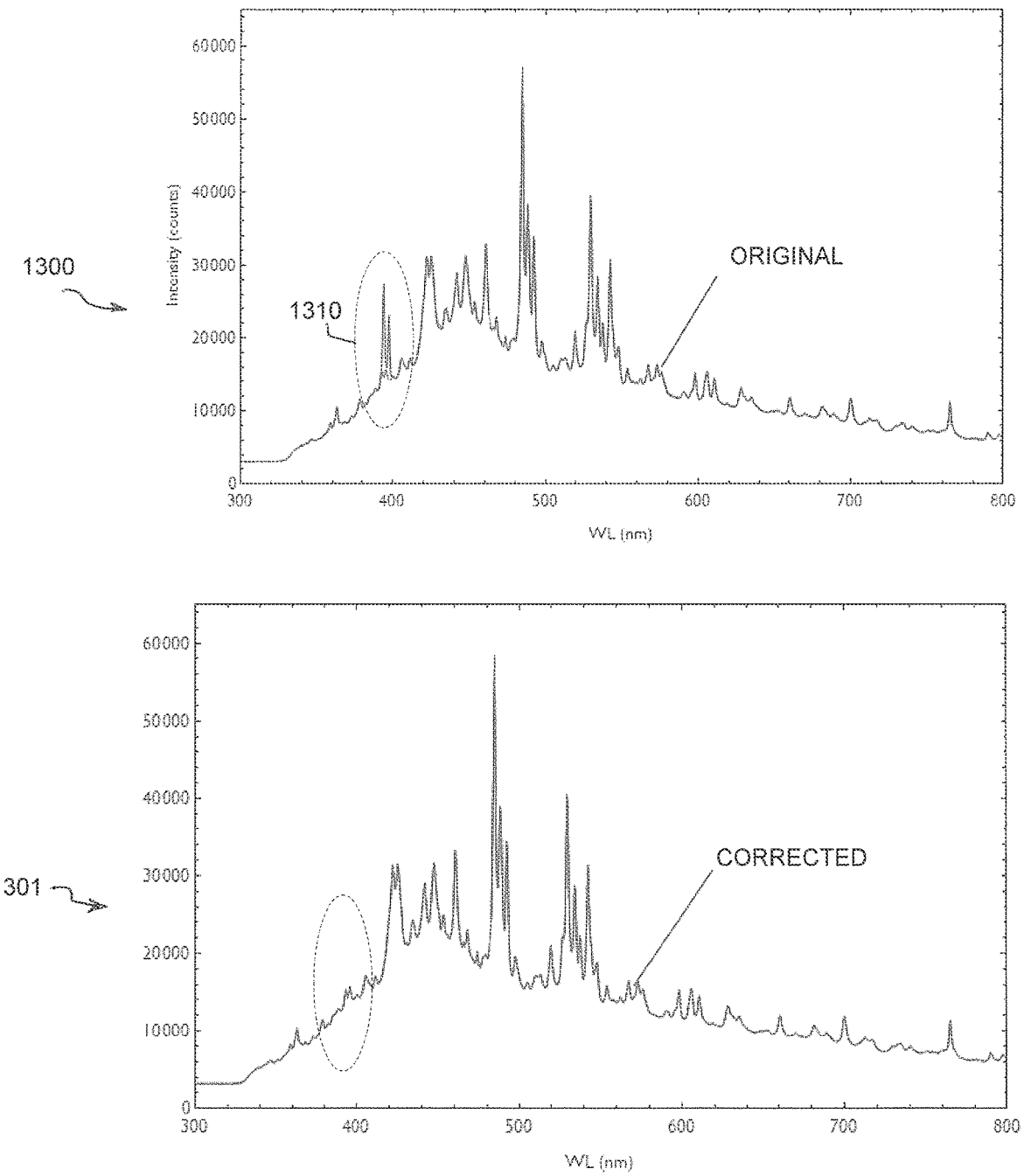

In FIG. 13, a complex anomalous signal 1310 spanning approximately ten elements of a spectral data array, which is typically spectral data array B, has been identified and corrected. The anomalous signal 1310 is indicated by a dashed oval enclosing the portion of the spectra of interest. The spectral data shown is from a Xenon flashlamp and the anomalous signal 1310 may be associated with anomalous signal event driven by an arc/discharge instability and/or an electrode sputter event within the flashlamp. Plot 1300 illustrates the spectral data array with the complex anomalous signal 1310 and plot 1301 illustrates the spectral data array wherein the complex anomalous signal 1310 has been modified. For each plot 1300 and 1301, the x axis is wavelength and the y axis is intensity or counts.

Figure 14:
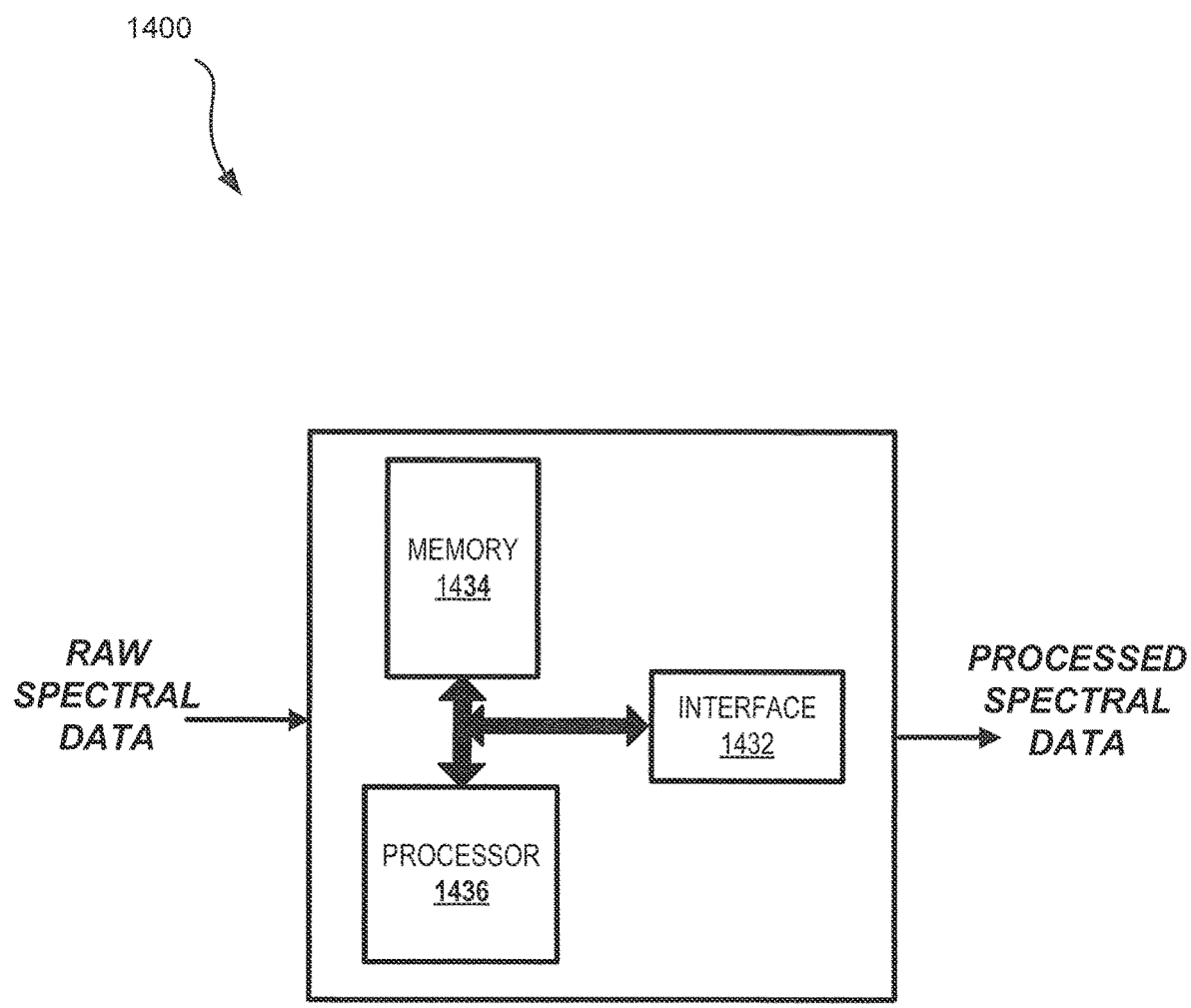
FIG. 14 illustrates a block diagram of an example of a computing device configured to identify and process anomalous signals in spectral data according to the principles of the disclosure.

FIG. 14 illustrates a computing device 1400 that can be used for processes disclosed herein, such as identifying anomalous signals in spectral data and processing the anomalous signals. The computing device 1400 can be a spectrometer or a portion of a spectrometer, such as spectrometer 160 or 510 disclosed herein. The computing device 1400 may include at least one interface 1432, a memory 1434 and a processor 1436. The interface 1432 includes the necessary hardware, software, or combination thereof to receive, for example, raw spectral data and to transmit, for example, processed spectral data. A portion of the interface 1432 can also include the necessary hardware, software, or combination thereof for communicating analog or digital electrical signals. The interface 1432 can be a conventional interface that communicates with via various communication systems, connections, busses, etc., according to protocols, such as standard protocols or proprietary protocols (e.g., interface 1432 may support I2C, USB, RS232, SPI, or MODBUS). The memory 1434 is configured to store the various software and digital data aspects related to the computing device 1400. Additionally, the memory 1434 is configured to store a series of operating instructions corresponding to an algorithm or algorithms that direct the operation of the processor 1436 when initiated to, for example, identify anomalous signals in spectral data and process identified anomalous signals. The processes 600, 700 and 800 being representative examples of algorithms. The processing may include removing or modifying the anomalous signal data or a different action. The memory 1434 can be a non-transitory computer readable medium (e.g., flash memory and/or other media).

The processor 1436 is configured to direct the operation of the computing device 1400. As such, the processor 1436 includes the necessary logic to communicate with the interface 1432 and the memory 1434 and perform the functions described herein to identify and process anomalous signals in spectral data. A portion of the above-described apparatus, systems or methods may be embodied in or performed by various, such as conventional, digital data processors or computers, wherein the computers are programmed or store executable programs of sequences of software instructions to perform one or more of the steps of the methods. The software instructions of such programs or code may represent algorithms and be encoded in machine-executable form on non-transitory digital data storage media, e.g., magnetic or optical disks, random-access memory (RAM), magnetic hard disks, flash memories, and/or read-only memory (ROM), to enable various types of digital data processors or computers to perform one, multiple or all of the steps of one or more of the above-described methods, or functions, systems or apparatuses described herein.

Portions of disclosed embodiments may relate to computer storage products with a non-transitory computer-readable medium that have program code thereon for performing various computer-implemented operations that embody a part of an apparatus, device or carry out the steps of a method set forth herein. Non-transitory used herein refers to all computer-readable media except for transitory, propagating signals. Examples of non-transitory computer-readable media include, but are not limited to: magnetic media such as hard disks, floppy disks, and magnetic tape; optical media such as CD-ROM disks; magneto-optical media such as floptical disks; and hardware devices that are specially configured to store and execute program code, such as ROM and RAM devices. Examples of program code include both machine code, such as produced by a compiler, and files containing higher level code that may be executed by the computer using an interpreter. Configured means, for example, designed, constructed, or programmed, with the necessary logic, algorithms, processing instructions, and/or features for performing a task or tasks.

The changes described above, and others, may be made in the optical measurement systems and subsystems described herein without departing from the scope hereof. For example, although certain examples are described in association with semiconductor wafer processing equipment, it may be understood that the optical measurement systems described herein may be adapted to other types of processing equipment such as roll-to-roll thin film processing, solar cell fabrication or any application where high precision optical measurement may be required. Furthermore, although certain embodiments discussed herein describe the use of a common light analyzing device, such as an imaging spectrograph, it should be understood that multiple light analyzing devices with known relative sensitivity may be utilized. Furthermore, although the term "wafer" has been used herein when describing aspects of the current invention, it should be understood that other types of workpieces such as quartz plates, phase shift masks, LED substrates and other non-semiconductor processing related substrates and workpieces including solid, gaseous and liquid workpieces may be used.

The exemplary embodiments described herein were selected and described in order to best explain the principles of the invention and the practical application, and to enable others of ordinary skill in the art to understand the invention for various embodiments with various modifications as are suited to the particular use contemplated. The particular embodiments described herein are in no way intended to limit the scope of the present invention as it may be practiced in a variety of variations and environments without departing from the scope and intent of the invention. Thus, the present invention is not intended to be limited to the embodiment shown, but is to be accorded the widest scope consistent with the principles and features described herein.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems which perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As will be appreciated by one of skill in the art, the present invention may be embodied as a method, system, or computer program product. Accordingly, the present invention may take the form of an entirely hardware embodiment, an entirely software embodiment (including firmware, resident software, micro-code, etc.) or an embodiment combining software and hardware aspects all generally referred to herein as a "circuit" or "module." Furthermore, the present invention may take the form of a computer program product on a computer-usable storage medium having computer-usable program code embodied in the medium.

Various aspects of the disclosure can be claimed including the apparatuses, systems, and methods disclosed herein. Aspects disclosed herein include:

A. A method of processing spectral data, including: (1) receiving temporally separated spectral data samples, and (2) identifying one or more anomalous signals in an intermediate one of the temporally separated spectral data samples based on at least one preceding and at least one subsequent ones of the spectral data samples.

B. An apparatus for processing spectral data, including: (1) a memory having operating instructions corresponding to an algorithm for identifying one or more anomalous signals, and (2) one or more processors configured to perform one or more operations according to the operating instructions, including: receiving temporally separated spectral data samples, and identifying the one or more anomalous signals in an intermediate one of the temporally separated spectral data samples based on at least one preceding and at least one subsequent ones of the spectral data samples.

C. A system for identifying anomalous signals, comprising: (1) a processing tool, and (2) an apparatus that receives optical data from a semiconductor process performed within the processing tool and converts the optical data to spectral data, the apparatus including: (2A) a memory having operating instructions corresponding to an algorithm for identifying one or more anomalous signals, and (2B) one or more processors configured to perform one or more operations according to the operating instructions, including: receiving temporally separated spectral data samples, and identifying the one or more anomalous signals in an intermediate one of the temporally separated spectral data samples based on at least one preceding and at least one subsequent ones of the spectral data samples.

D. A computer program product stored on a non-transitory computer readable medium that includes a series of operating instructions that direct one or more processors, when initiated thereby, to process spectral data by performing operations including: (1) receiving temporally separated spectral data samples, and (2) identifying one or more anomalous signals in an intermediate one of the temporally separated spectral data samples based on at least one preceding and at least one subsequent ones of the spectral data samples.

Each of aspects A, B, C, and D can have one or more of the following additional elements in combination: Element 1: wherein there are three temporally separated spectral data samples and the intermediate one is the middle one of the three. Element 2: wherein the at least one preceding one and the at least one subsequent one of the spectral data samples bracket the one or more anomalous signals in the intermediate one. Element 3: wherein the identifying includes comparing a width count of spectral data at elements of the temporally separated spectral data samples to a width count limit corresponding to a number of counts. Element 4: wherein the identifying further includes comparing a difference, which is between elements of the intermediate one of the temporally separated spectral data sample and a mean of corresponding elements of the at least one preceding and at least one subsequent ones of the spectral data samples, to an intensity threshold value. Element 5: wherein the intensity threshold value is predetermined. Element 6: wherein the intensity threshold value is dynamically set. Element 7: further comprising incrementing the width count when the difference is greater than the intensity threshold value. Element 8: further comprising processing the one or more identified anomalous signals. Element 9: wherein the processing includes modifying at least one of the one or more count values of the elements identified to include anomalous signals. Element 10: wherein the processing includes modifying, based on an adjacency parameter, at least one or more count values of additional elements proximate the elements identified to include the anomalous signals. Element 11: wherein the processing includes not modifying at least one of the one or more count values of the elements identified to include anomalous signals. Element 12: wherein the modifying is carried out based on comparing a difference, which is between elements of the intermediate one of the temporally separated spectral data sample and a mean of corresponding elements of the at least one preceding and at least one subsequent ones of the spectral data samples, to an intensity threshold value. Element 13: wherein at least some logic for the method is in an embedded processor, a field-programmable gate array (FPGA), stored as code, or a combination of both. Element 14: wherein the apparatus is a spectrometer. Element 15: wherein at least one of the one or more processors comprises a field-programmable gate array (FPGA).

What is claimed is:

1. A method of processing spectral data, comprising:
   receiving temporally separated spectral data samples; and
   identifying one or more anomalous signals in an intermediate one of the temporally separated spectral data samples based on at least one preceding and at least one subsequent ones of the spectral data samples, wherein the identifying includes comparing a width count of spectral data at elements of the temporally separated spectral data samples to a width count limit corresponding to a number of counts and comparing a difference to an intensity threshold value, wherein the difference is between elements of the intermediate one of the temporally separated spectral data sample and a mean of corresponding elements of the at least one preceding and at least one subsequent ones of the spectral data samples.

2. The method as recited in claim 1, wherein there are three temporally separated spectral data samples and the intermediate one is the middle one of the three.

3. The method as recited in claim 1, wherein the at least one preceding one and the at least one subsequent one of the spectral data samples bracket the one or more anomalous signals in the intermediate one.

4. The method as recited in claim 1, wherein the intensity threshold value is predetermined.

5. The method as recited in claim 1, wherein the intensity threshold value is dynamically set.

6. The method as recited in claim 1, further comprising incrementing the width count when the difference is greater than the intensity threshold value.

7. The method as recited in claim 1, further comprising processing the one or more identified anomalous signals.

8. The method as recited in claim 7, wherein the processing includes modifying at least one of the one or more count values of the elements identified to include anomalous signals.

9. The method as recited in claim 8, wherein the processing includes modifying, based on an adjacency parameter, at least one or more count values of additional elements proximate the elements identified to include the anomalous signals.

10. The method as recited in claim 8, wherein the modifying is carried out based on comparing a difference, which is between elements of the intermediate one of the temporally separated spectral data sample and a mean of corresponding elements of the at least one preceding and at least one subsequent ones of the spectral data samples, to an intensity threshold value.

11. The method as recited in claim 7, wherein the processing includes not modifying at least one of the one or more count values of the elements identified to include anomalous signals.

12. The method as recited in claim 1, wherein at least some logic for the method is in an embedded processor, a field-programmable gate array (FPGA), stored as code, or a combination of both.

13. An apparatus for processing spectral data, comprising:
a memory having operating instructions corresponding to an algorithm for identifying one or more anomalous signals; and
one or more processors configured to perform one or more operations according to the operating instructions, including:
receiving temporally separated spectral data samples; and
identifying the one or more anomalous signals in an intermediate one of the temporally separated spectral data samples based on at least one preceding and at least one subsequent ones of the spectral data samples, wherein the identifying includes comparing a difference, which is between elements of the intermediate one of the temporally separated spectral data sample and a mean of corresponding elements of the at least one preceding and at least one subsequent ones of the spectral data samples, to an intensity threshold value corresponding to a number of counts.

14. The apparatus as recited in claim 13, wherein the apparatus is a spectrometer.

15. The apparatus as recited in claim 13, wherein the identifying further includes incrementing a width count of spectral data at elements of the temporally separated spectral data samples when the difference is greater than the intensity threshold value.

16. The apparatus as recited in claim 15, wherein the identifying further includes comparing the width count to a width count limit corresponding to a number of counts.

17. The apparatus as recited in claim 16, wherein the operations further include processing the one or more identified anomalous signals.

18. The apparatus as recited in claim 17, wherein the processing includes modifying at least one of the one or more count values of the elements identified to include anomalous signals.

19. The apparatus as recited in claim 18, wherein the processing further includes modifying, based on an adjacency parameter, at least one or more count values of additional elements proximate the elements identified to include the anomalous signals.

20. The apparatus as recited in claim 18, wherein the modifying is carried out based on the difference.

21. The apparatus as recited in claim 13, wherein at least one of the one or more processors comprises a field-programmable gate array (FPGA).

22. A system for identifying anomalous signals, comprising:
a processing tool; and
an apparatus that receives optical data from a semiconductor process performed within the processing tool and converts the optical data to spectral data, the apparatus including:
a memory having operating instructions corresponding to an algorithm for identifying one or more anomalous signals; and
one or more processors configured to perform one or more operations according to the operating instructions, including:
receiving temporally separated spectral data samples; and
identifying the one or more anomalous signals in an intermediate one of the temporally separated spectral data samples based on at least one preceding and at least one subsequent ones of the spectral data samples, wherein the identifying includes comparing a difference, which is between elements of the intermediate one of the temporally separated spectral data sample and a mean of corresponding elements of the at least one preceding and at least one subsequent ones of the spectral data samples, to an intensity threshold value corresponding to a number of counts.

23. A computer program product stored on a non-transitory computer readable medium that includes a series of operating instructions that direct one or more processors, when initiated thereby, to process spectral data by performing operations comprising:
receiving temporally separated spectral data samples; and
identifying one or more anomalous signals in an intermediate one of the temporally separated spectral data samples based on at least one preceding and at least one subsequent ones of the spectral data samples, wherein the identifying includes comparing a difference, which is between elements of the intermediate one of the temporally separated spectral data sample and a mean of corresponding elements of the at least one preceding and at least one subsequent ones of the spectral data samples, to an intensity threshold value corresponding to a number of counts.

* * * * *